US012765272B2

(12) United States Patent
Briatico et al.

(10) Patent No.: US 12,765,272 B2
(45) Date of Patent: Oct. 13, 2026

(54) METHOD FOR MANUFACTURING AN ELECTRONIC DEVICE COMPRISING AT LEAST ONE SUPERCONDUCTIVE ZONE AND ASSOCIATED DEVICE

(71) Applicants: THALES, Courbevoie (FR); Centre national de la recherche scientifique, Paris (FR); UNIVERSITE PARIS-SACLAY, Gif sur Yvette (FR)

(72) Inventors: Javier Briatico, Palaiseau (FR); José-Paolo Martins, Palaiseau (FR); Juan Trastoy, Palaiseau (FR); Christian Ulysse, Palaiseau (FR)

(73) Assignees: THALES, Courbevoie (FR); CENTRE NATIONAL DE LA RECHERCHE SCIENTIFIQUE, Paris (FR); UNIVERSITE PARIS-SACLAY, Gif-sur-Yvette (FR)

( * ) Notice: Subject to any disclaimer, the term of this patent is extended or adjusted under 35 U.S.C. 154(b) by 778 days.

(21) Appl. No.: 17/797,794

(22) PCT Filed: Feb. 4, 2021

(86) PCT No.: PCT/EP2021/052684
§ 371 (c)(1),
(2) Date: Aug. 5, 2022

(87) PCT Pub. No.: WO2021/156378
PCT Pub. Date: Aug. 12, 2021

(65) Prior Publication Data

US 2023/0051835 A1 Feb. 16, 2023

(30) Foreign Application Priority Data

Feb. 5, 2020 (FR) ....................................... 2001126

(51) Int. Cl.
*H10N 60/01* (2023.01)
*H10N 60/12* (2023.01)

(52) U.S. Cl.
CPC ......... *H10N 60/0912* (2023.02); *H10N 60/12* (2023.02)

(58) Field of Classification Search
CPC ............... H10N 60/0912; H10N 60/12; H10N 60/0268; H10N 60/0688; H10N 60/815
See application file for complete search history.

(56) References Cited

U.S. PATENT DOCUMENTS 10,516,248 B1 * 12/2019 Taylor ................... H01S 3/1683
2009/0131262 A1 * 5/2009 Zhang ................ H10N 60/0801
505/410

(Continued)

OTHER PUBLICATIONS

International Search Report dated Mar. 18, 2021 in International Application No. PCT/EP2021/052684.

(Continued)

*Primary Examiner* — Fernando L Toledo
*Assistant Examiner* — Marshall Mu-Nuo Hatfield
(74) *Attorney, Agent, or Firm* — B. Aaron Schulman, Esq.; Stites & Harbison, PLLC

(57) ABSTRACT

The invention relates to a method of manufacturing a device, the device comprising a superconducting zone (20) and an insulating zone (22) in an arrangement, comprising the steps of:

depositing a buffer layer (12) on a portion of a substrate (10), etching the buffer layer (12) to obtain two zones (Z1, Z2), each first zone (Z1) being a zone in which the substrate (10) is covered by the buffer layer (12) and intended to form a respective superconducting zone (20), each second zone (Z2) being a zone in which the substrate (10) is exposed to form a respective insulating zone (22), and (Continued)

depositing a second layer (18) of superconducting material on the entire substrate portion (10), the first layer (12) being made of at least two superimposed sublayers (14, 16).

10 Claims, 6 Drawing Sheets

(56) References Cited

U.S. PATENT DOCUMENTS

| | | | | |
|---|---|---|---|---|
| 2016/0163424 | A1* | 6/2016 | Wang | H10N 60/0688<br>174/268 |
| 2016/0233405 | A1* | 8/2016 | Crete | H10N 60/124 |
| 2019/0363128 | A1* | 11/2019 | Rosenblatt | B82Y 10/00 |
| 2020/0144476 | A1* | 5/2020 | Huang | H01L 23/528 |

OTHER PUBLICATIONS

Written Opinion dated Mar. 18, 2021 in International Application No. PCT/EP2021/052684.

Preliminary Search Report dated Nov. 27, 2020 in French Application No. 2001126.

* cited by examiner

METHOD FOR MANUFACTURING AN ELECTRONIC DEVICE COMPRISING AT LEAST ONE SUPERCONDUCTIVE ZONE AND ASSOCIATED DEVICE

TECHNICAL FIELD

The present invention relates to a method of manufacturing an electronic device, the electronic device comprising at least one superconducting zone and at least one insulating zone in a predefined arrangement. The present invention further relates to an electronic device obtainable by such a method.

BACKGROUND

A superconducting material has zero resistance under certain temperature conditions. An electronic device made of components with layers made of such a material therefore has particularly good electrical performance.

It is therefore desirable to have manufacturing methods that allow such electronic devices to be obtained reliably and relatively easily.

In such a case, the development of electronic devices involves different types of etching to obtain, in particular, tracks or electrodes. The etchings are chemical or ionic.

However, such techniques are not suitable for devices involving thicknesses of less than 50 nanometres (nm). Indeed, chemical etching produces electrode edges with roughnesses comparable to the width of the tracks (which risks cutting the tracks), while ion etching reduces the oxygen content of the electrode edges, degrading the physical properties of the superconducting material and thus the electrical performance of the devices.

Also, it is known to use a technique exploiting oxygen ion irradiation to make superconducting wires. The technique is based on the fact that the disorder produced by ion bombardment (generating oxygen gap-interstitial pairs) locally reduces the critical temperature of the superconducting material.

However, the devices obtained by this technique show reduced performance when exposed to temperatures of 80° C. and above.

There is therefore a need for a method of manufacturing an electronic device with superconducting zones that is more robust to heating.

SUMMARY

For this purpose, the present description relates to a method of manufacturing an electronic device, the electronic device comprising at least one superconducting zone and at least one insulating zone according to a predefined arrangement, the method comprising at least the steps of depositing a first layer on at least a part of a substrate, the first layer being a buffer layer, etching the first layer according to the predefined arrangement to obtain at least one first zone and at least one second zone, each first zone being an zone in which the substrate is covered by the first layer and each first zone being intended to form a respective superconducting zone, each second zone being an zone in which the substrate is exposed and each second zone being intended to form a respective insulating zone, and depositing a second layer on the whole of the substrate portion, the second layer being of superconducting material, wherein the first layer is made in the form of at least two superimposed sub-layers.

According to particular embodiments, the manufacturing method has one or more of the following features taken in isolation or in any combination that is technically possible:

- the substrate is made of a material, the superconducting material comprising a plurality of chemical elements, the material of the substrate being a material in which at least one chemical element of the superconducting material diffuses into the material of the substrate when the two materials are in contact and heated to a temperature of 200° C. or more, the material of the substrate being in particular Si or GaAs.
- the superconducting material is a cuprate, preferably one selected from the list consisting of YBCO, NdBaCuO, GdBaCuO, BiSrCaCuO and TlCaBaCuO.
- each sub-layer of the first layer is made of a material selected from the list consisting of YSZ, $CeO_2$, zirconia, $MgAl_2O_4$, $BaTiO_3$, MgO, $Al_2O_3$, AlN, and $SrTiO_3$.
- the substrate material is Si, the first sub-layer material is YSZ, the second sub-layer material is $CeO_2$ and the superconducting material is a cuprate.
- the substrate material is Si, the first sub-layer material is $SrTiO_3$, the second sub-layer material is $CeO_2$ and the superconducting material is a cuprate.
- the substrate material is GaAs, the first sub-layer material is MgO, the second sub-layer material is $CeO_2$ and the superconducting material is a cuprate.
- the electronic device is a Josephson junction, the predefined arrangement comprising two superconducting zones and an insulating zone intended to form a barrier zone having a maximum dimension along a direction connecting the two superconducting zones of less than or equal to 60 nanometres.
- the first layer has a thickness between 10 nanometres and 80 nanometres.
- the thickness of the second layer is between 3 nanometres and 50 nanometres.
- each superconducting zone is a track.

The present description relates to an electronic device obtainable by the manufacturing method as previously described.

BRIEF DESCRIPTION OF THE DRAWINGS

Other characteristics and advantages of the invention will become apparent upon reading the following description of embodiments of the invention, given only as an example and referencing the drawings, in which.

DETAILED DESCRIPTION OF EMBODIMENTS

Figure 1:
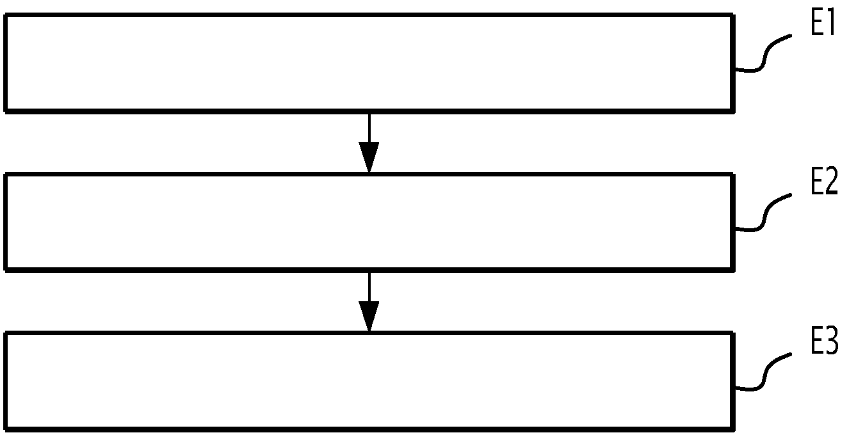
FIG. 1 is a flowchart of an example method for manufacturing an electronic device comprising three steps.

A method of manufacturing an electronic device is now described with reference to the flowchart in FIG. 1 which illustrates an example implementation.

The manufacturing method is intended to obtain an electronic device with at least one superconducting zone and at least one insulating zone in a predefined arrangement.

By definition, the arrangement is the spatial organisation of each of the zones.

In the following, by way of illustration, it is desired to obtain a first electronic device comprising two parallel superconducting tracks separated by an insulating zone.

In such a case, the arrangement is an arrangement in the form of five contiguous bands. The five bands are successively a first insulating zone, a first superconducting zone forming a track, a second insulating zone, a second superconducting zone forming another track, and a third insulating zone.

The manufacturing method comprises three steps which are a step of depositing a first layer E1, an etching step E2 and a step of depositing a second layer E3.

It is assumed that a substrate 10 has been provided in advance.

The substrate 10 is made of silicon (Si).

In the step of depositing a first layer E1, a first layer 12 is deposited on at least a part of the substrate 10.

Figure 2:
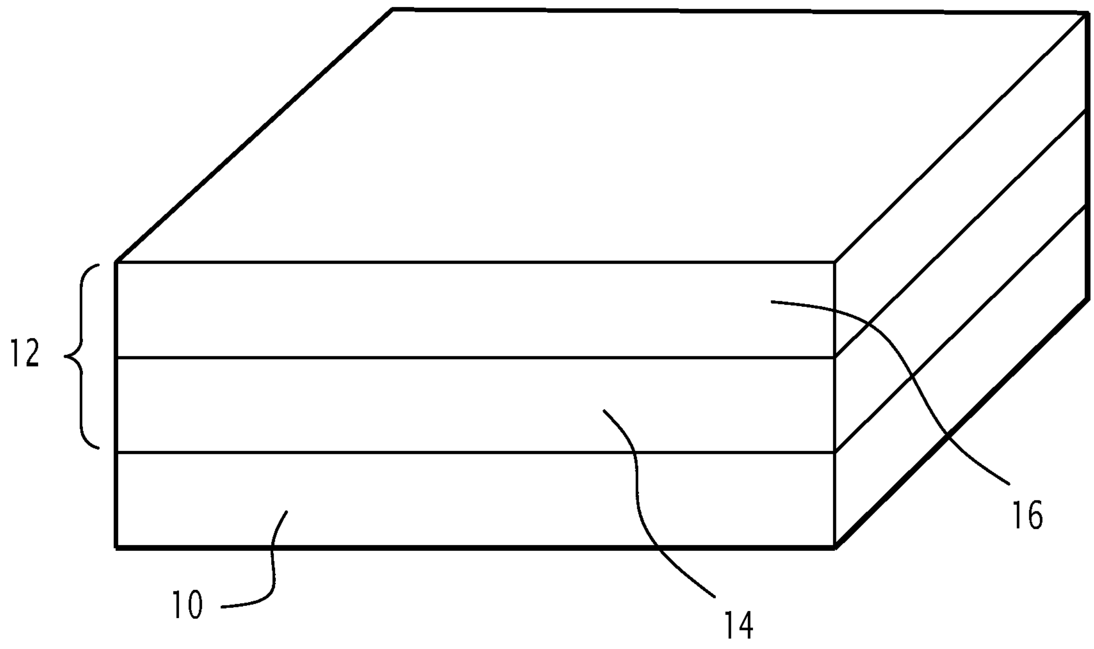
FIG. 2 is a schematic perspective representation of a cross-section of an assembly obtained after the implementation of the first step of the manufacturing method of a first example of an electronic device.

The step of depositing a first layer E1 makes it possible to obtain the assembly shown in FIG. 2.

The substrate portion 10 is a portion having an extent sufficiently large to allow the predefined arrangement to be made within the substrate portion 10.

The first layer 12 is a buffer layer.

By the term "buffer layer" it is understood that the first layer 12 is made to provide insulation between the substrate 12 and a superconducting material, the buffer layer preventing contact between the two materials.

According to the proposed example, in order to achieve such a buffer effect, the first layer 12 is made in the form of two superimposed sub-layers, a first sub-layer 14 and a second sub-layer 16.

The first sub-layer 14 is arranged between the substrate 10 and the second sub-layer 16.

The first sub-layer 14 is made of YSZ and the second sub-layer 16 of $CeO_2$.

YSZ is Yttrium-stabilised zirconia.

For example, the first layer 12 has a thickness between 10 nanometres (nm) and 80 nm.

The thickness of a layer is measured in a direction corresponding to the stacking direction of the layers.

However, it is possible to obtain a first layer 12 forming a buffer layer in other ways.

For example, in one embodiment, the first layer 12 is formed by a single sub-layer.

Cases with more than two sub-layers forming the first layer 12 are also possible.

Furthermore, the material of each sub-layer 14 or 16 of the first layer 12 may be different from the above materials.

In particular, the material of each sub-layer 14 or 16 is selected from MgO or $SrTiO_3$.

More generally, each sub-layer 14 or 16 forming the first layer 12 is made of a material selected from the list consisting of YSZ, $CeO_2$, zirconia, $MgAl_2O_4$, $BaTiO_3$, MgO, AlN and $SrTiO_3$.

At the end of the first step of deposition E1, the set of layers shown in FIG. 2 is obtained.

The etching step E2 is then carried out.

The etching step E2 is a step of etching the first layer 12 according to the predefined arrangement in the substrate portion 10.

The etching is, for example, a chemical etching.

Alternatively, the etching is an ionic etching.

The predefined arrangement is then an etching pattern.

Such an etching step E2 makes it possible to obtain at least one first zone Z1 and at least one second zone Z2.

Each first zone Z1 is a non-etched zone.

Thus, each first zone Z1 is a zone in which the substrate 10 is covered by the entire first layer 12.

Each first zone Z1 is intended to form a respective superconducting zone.

Each second zone Z2 is an etched zone.

The etching is done so that the entire first layer 12 is removed. Each second zone Z2 is a zone in which the substrate 10 is exposed.

Each second zone Z2 is a zone intended to form a respective insulating zone.

In the illustrated case, the etching pattern is a set of bands. More precisely, the etching pattern is a set of three etching bands. The first band and the second band delimit a non-etching band (first track) and the second band and the third band delimit another non-etching band (second track).

The non-etching bands are thus delimited by walls extending perpendicular to the plane of the substrate 10. Such walls are referred to as vertical walls in the following.

Figure 3:
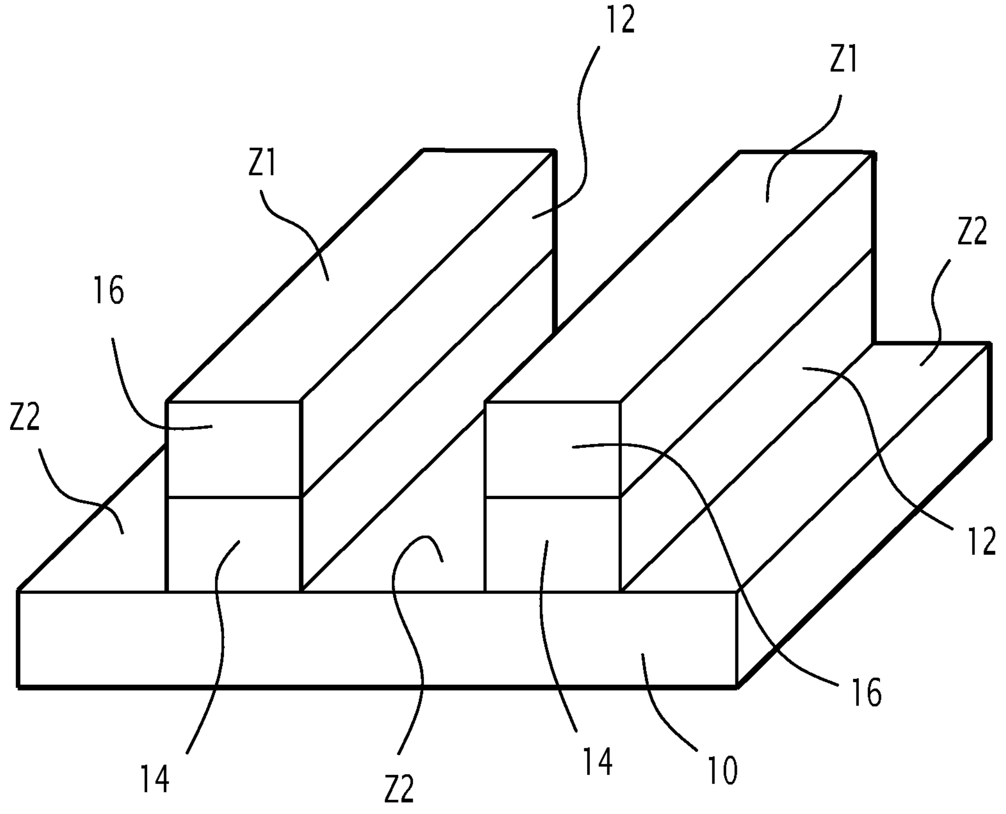
FIG. 3 is a schematic perspective representation of a cross-section of an example assembly obtained after the implementation of the second step of the manufacturing method of the first example of an electronic device.
Figure 4:
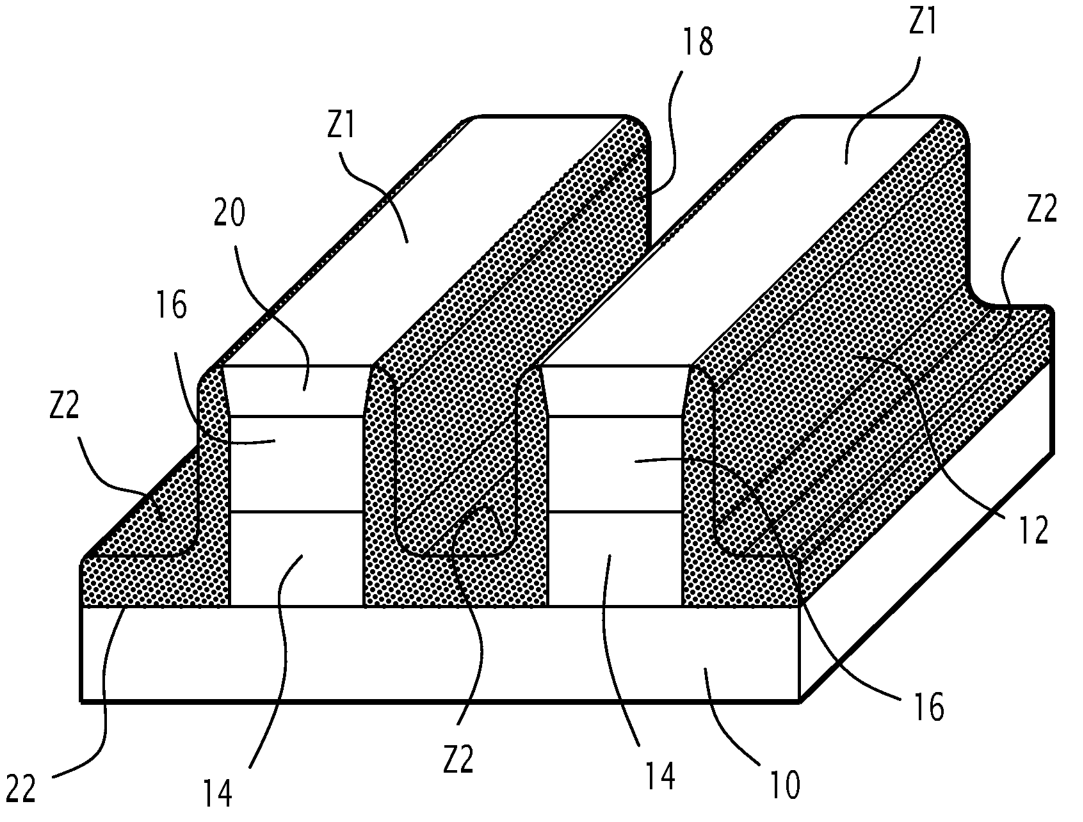
FIG. 4 is a schematic perspective representation of a cross-section of the first device obtained after the implementation of the manufacturing process.

At the end of the etching step E2, as can be seen in FIG. 3, an assembly is thus obtained comprising successively a second zone Z2, a first zone Z1, a second zone Z2, a first zone Z1 and a second zone Z2.

The step of depositing the second layer E3 or second deposition step E3 is then implemented.

For example, the deposition of the second layer E3 is carried out by a pulsed laser ablation technique or by a sputtering technique.

The second layer 18 is deposited on the entire substrate portion 10.

The second deposition step E3 is thus a full plate deposition step.

The second deposited layer 18 is made of superconducting material.

The superconducting material is a high-temperature superconducting material, i.e. a superconducting material with a critical temperature of 40K or above.

In the proposed example, the superconducting material is $YBa_2Cu_3O_{7-x}$.

$YBa_2Cu_3O_{7-x}$ is a mixed oxide of barium, copper and yttrium. The terms "YBaCuO" and "YBCO" are also used to designate such an oxide.

Typically, YBCO has a critical temperature of 90K when the cation and oxygen content is optimal.

Alternatively, the chosen superconducting material is NdBaCuO, GdBaCuO, BiSrCaCuO or TlCaBaCuO.

More generally, the superconducting material is a cuprate.

By definition, a cuprate is a chemical compound in which copper forms an anion or complex with an overall negative charge.

The thickness of the second layer 18 is between 3 nm and 50 nm.

Once deposited, in each first zone Z1, the superconducting material is in contact with the material of the second sub-layer 16, in this case $CeO_2$. No reaction takes place between the two materials.

Thus, each first zone Z1 becomes a superconducting zone 20 corresponding to one of the desired tracks for the device to be manufactured.

Formulated differently, YBCO deposited on $CeO_2$ will be superconducting at high temperatures (i.e. a temperature of the order of 90K in particular if the oxygen content is optimal as explained above for the case of YBCO)

In the second deposition step E3, the superconducting material is also deposited on the vertical walls.

Since the growth cannot be epitaxial on the vertical walls, the superconducting material loses its superconducting properties during deposition.

In other words, YBCO deposited on the vertical walls of YSZ and $CeO_2$ will not be superconducting.

For each second zone Z2, a reaction takes place between the substrate material 10 and the superconducting material.

Specifically, as the deposition is performed at a temperature of 200° C. or above, at least one chemical element of the superconducting material diffuses into the substrate material 10 when the two materials are in contact.

In this case, the barium diffuses into the substrate 10. The $Ba_2SiO_4$ compound, which is an insulator, is then formed while the YBCO will decrease in barium content until the YBCO becomes insulator.

This phenomenon is observed for thicknesses as great as 50 nm.

Each second zone Z2 thus becomes an insulating zone 22 corresponding to an insulating zone for the device to be manufactured.

At the end of the second deposition step E3, the desired electronic device is obtained, namely two isolated superconducting tracks.

This has been demonstrated experimentally by the applicant. A resistivity of 69 Ohm·m was measured in the insulating zone 22 between the two superconducting zones 20. Such a value is 10,000 times greater than the resistivity in one of the superconducting zones 20.

This shows that the superconducting zones 20 are electrically isolated from each other.

The method is relatively simple in that the deposition of the second layer 18 leads to a self-functionalisation of the second layer 18. The superconducting zones 20 separated by the insulating zones 22 are in fact formed without etching the second layer 18, which is a superconducting layer.

This avoids degradation of the properties of the second layer 18 in the useful zones, which would occur if ionic attacks (ion bombardment, in particular by oxygen ions) or chemical attacks (in the case of etching with an acid) were used.

In other words, the manufacturing method ensures good isolation between the individual superconducting zones 20 on the functionalised substrate 10 over the entire temperature range, and excellent performance of the superconducting zones 20, as the superconducting zones are not modified by ion etching.

The performance of the devices manufactured by the method is thus increased.

Furthermore, due to the steps involved, the method is robust at high temperatures. In other words, the method described is a method of manufacturing an electronic device with superconducting zones that is more robust to heating.

The method can also be used to form many superconductor-based devices.

Figure 5:
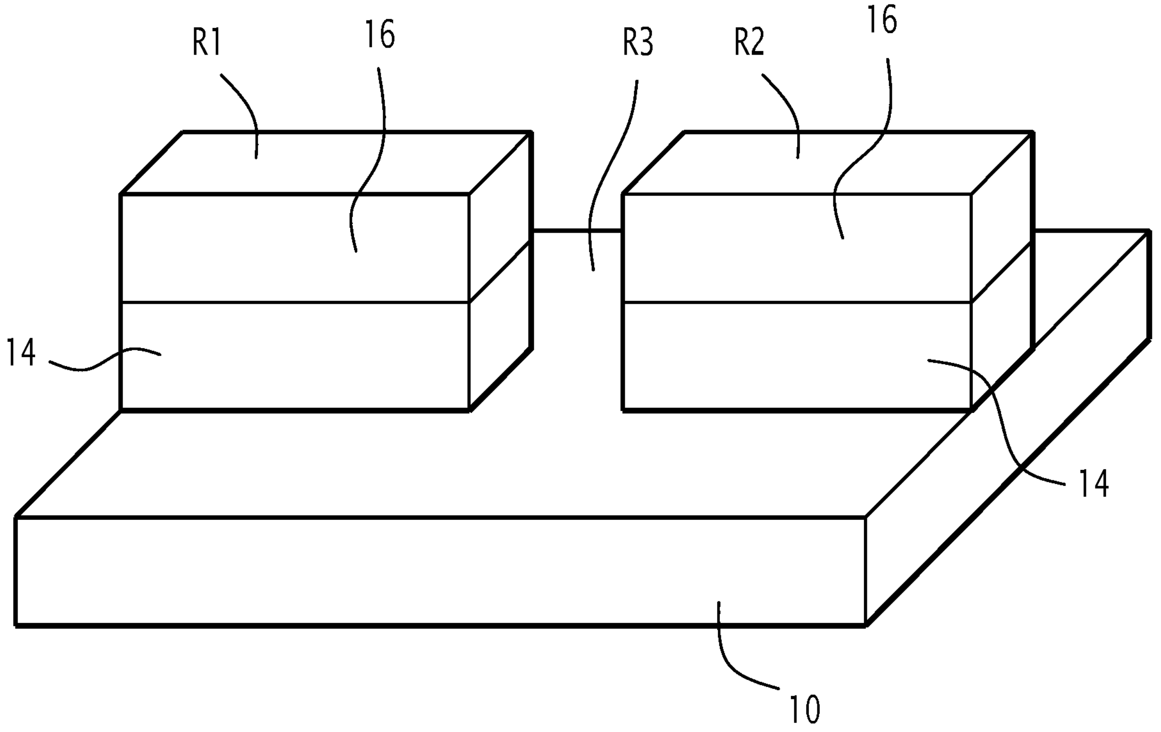
FIG. 5 is a schematic perspective representation of an example assembly obtained after the implementation of the second step of the manufacturing method of the second example of an electronic device.
Figure 6:
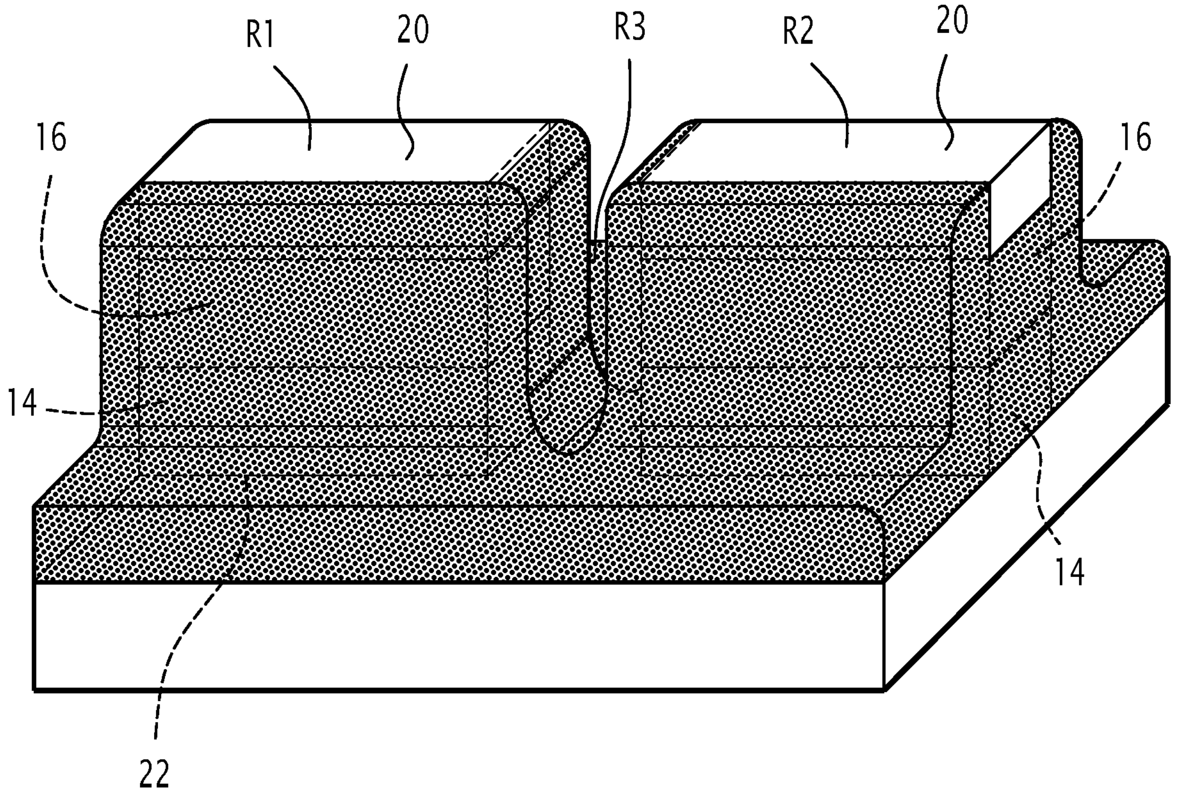
FIG. 6 is a schematic perspective representation of a second device obtained after the implementation of the manufacturing method.

In particular, as illustrated with reference to FIGS. 5 (assembly after etching step E2) and 6 (assembly after the second deposition step E3), the method enables the fabrication of a YBCO-based Josephson junction on a silicon substrate 10.

In such a case, the predefined arrangement comprises two superconducting zones R1, R2 (also called a reservoir) and an insulating zone R3 intended to form a barrier zone between the two superconducting zones R1 and R2.

Such an arrangement also corresponds to a superconducting track formed by the two superconducting zones R1 and R2 interrupted at a gap corresponding to the insulating zone R3.

The insulating zone R3 has a maximum dimension along a direction connecting the two superconducting zones of 60 nm or less.

In other words, the minimum distance between the two superconducting zones R1 and R2 (defined as the minimum distance between two points in these two zones) is less than or equal to 60 nm.

Preferably, the gap between the two superconducting zones R1 and R2 has a size between 10 nm and 30 nm (in the broad sense, including the terminals).

As before, the method involves etching the desired pattern, with sizes of 60 nm or less being accessible to the above etching techniques.

At the end of the etching step, the first zones R1 and R2 are in the form of mesas.

Then the superconducting layer 18 is deposited.

The insulating zone R3 is formed by the reaction of the superconducting layer 18 with the substrate 10.

The manufacturing method thus allows the production of Josephson junctions that are not altered by subsequent annealing of the devices, allowing a higher operating temperature range than junctions produced by oxygen ion irradiation.

Hot electron bolometers, superconducting single-photon devices (also known as SSPDs) or kinetic inductance detectors (also known as KIDs) or resonators can also be obtained with this method.

In each example implementation of the manufacturing method, the reaction property between the substrate material 10 and the superconducting material is advantageously used.

In addition, the manufacturing method in each case is robust to heating the devices to temperatures above 80° C., unlike techniques involving oxygen ion irradiation.

Thus, the method is applicable to any substrate material 10 in which at least one chemical element of the superconducting material diffuses into the substrate material when the two materials are in contact and heated to 200° C. or above.

For example, the substrate material may also be gallium arsenide (GaAs).

Other embodiments are possible by combining the features of the above embodiments, where such features are technically compatible.

In particular, it is conceivable to obtain a method of manufacturing an electronic device in which the substrate material 10 is Si, the material of the first sub-layer 14 is YSZ, the second sub-layer material 16 is $CeO_2$ and the superconducting material is a cuprate.

Alternatively, it is conceivable to obtain a method of manufacturing in which the substrate material 10 is Si, the material of the first sub-layer 14 is $SrTiO_3$, the second sub-layer material 16 is $CeO_2$ and the superconducting material is a cuprate.

Alternatively, the material of the second sub-layer 16 is $MgAl_2O_4$, AlN, MgO, $BaTiO_3$, zirconia or $Al_2O_3$.

According to another alternative, the manufacturing method is a manufacturing method in which the substrate material 10 is GaAs, the material of the first sub-layer 14 is MgO, the material of the second sub-layer 16 is $CeO_2$ and the superconducting material is a cuprate.

The invention claimed is:

1. A method of manufacturing an electronic device, the electronic device comprising at least one superconducting zone and at least one insulating zone in a predefined arrangement, the method comprising carrying out sequentially in specific order the following method elements:

depositing a first layer on at least part of a substrate, the first layer being a buffer layer, etching the first layer in the predefined arrangement to obtain at least one first zone and at least one second zone, each first zone being a zone in which the substrate is covered by the first layer and each first zone being intended to form a respective superconducting zone, each second zone being a zone in which the substrate is exposed and each second zone capable of forming a respective insulating zone, depositing a second layer over the entire substrate including the at least one first zone and the at least one second zone, the second layer comprising a superconducting material, and annealing the substrate, the first layer, and the second layer at a temperature of 200° C. or more, wherein the first layer is made of at least two superimposed sub-layers, wherein the superconducting material comprises a cuprate, the substrate being made of a material in which at least one chemical element of the superconducting material diffuses into the material of the substrate when the two materials are in contact and heated to a temperature of 200° C. or more.

2. The method according to claim 1, wherein each sub-layer of the first layer is made of a material selected from the group consisting of YSZ, $CeO_2$, zirconia, $MgAl_2O_4$, $BaTiO_3$, MgO, AlN and $SrTiO_3$.

3. The method according to claim 1, wherein:

the substrate material is Si, the material of the first sub-layer is YSZ, the material of the second sub-layer is $CeO_2$ and the superconducting material is a cuprate, or the substrate material is Si, the material of the first sub-layer is $SrTiO_3$, the material of the second sub-layer is $CeO_2$ and the superconducting material is a cuprate, or the substrate material is GaAs, the material of the first sub-layer is MgO, the material of the second sub-layer is $CeO_2$ and the superconducting material is a cuprate.

4. The method according to claim 1, wherein the electronic device is a Josephson junction, the predefined arrangement comprising two superconducting zones and an insulating zone for forming a barrier zone having a maximum dimension along a direction connecting the two superconducting zones of less than or equal to 60 nanometers.

5. The method according to claim 1, wherein the first layer has a thickness between 10 nanometers and 80 nanometers.

6. The method according to claim 1, wherein the thickness of the second layer is between 3 nanometers and 50 nanometers.

7. The method according to claim 1, wherein each superconducting zone is a track.

8. An electronic device obtainable by the manufacturing method according to claim 3.

9. The method according to claim 1, wherein the material of the substrate is Si or GaAs.

10. The method according to claim 1, wherein the superconducting material is selected from the group consisting of YBCO, NdBaCuO, GdBaCuO, BiSrCaCuO, and TlCaBaCuO.

* * * * *